United States Patent [19]
Eklund

[11] Patent Number: 5,541,134
[45] Date of Patent: *Jul. 30, 1996

[54] BICMOS PROCESS THAT SUPPORTS MERGED DEVICES

[75] Inventor: Robert H. Eklund, Plano, Tex.

[73] Assignee: Texas Instruments Incorporated, Dallas, Tex.

[*] Notice: The term of this patent shall not extend beyond the expiration date of Pat. No. 5,334,549.

[21] Appl. No.: 234,194

[22] Filed: Apr. 28, 1994

Related U.S. Application Data

[63] Continuation of Ser. No. 106,458, Aug. 13, 1993, Pat. No. 5,334,549.

[51] Int. Cl.$^6$ .................................................. H01L 21/8249
[52] U.S. Cl. ............................ 437/59; 437/162; 437/952; 148/DIG. 123
[58] Field of Search .............................. 437/59, 162, 952, 437/961; 148/DIG. 9, DIG. 103, DIG. 123

[56] References Cited

U.S. PATENT DOCUMENTS

| | | | |
|---|---|---|---|
| 4,495,376 | 1/1985 | Hightower et al. | 257/696 |
| 4,541,167 | 9/1985 | Havemann et al. | 437/70 |
| 4,958,213 | 9/1990 | Eklund et al. | 257/378 |
| 4,987,089 | 1/1991 | Roberts | 437/34 |
| 5,006,476 | 4/1991 | De Jong et al. | 437/162 |
| 5,028,557 | 7/1991 | Tsai et al. | 437/59 |
| 5,106,765 | 4/1992 | Mizutani et al. | 437/162 |
| 5,171,699 | 12/1992 | Hutter et al. | 437/41 |
| 5,171,702 | 12/1992 | Prengle et al. | 437/59 |
| 5,262,345 | 11/1993 | Nasser et al. | 437/59 |
| 5,334,549 | 8/1994 | Eklund | 437/59 |

FOREIGN PATENT DOCUMENTS

| | | |
|---|---|---|
| 0436297 | 7/1991 | European Pat. Off. . |
| 61-136255 | 6/1986 | Japan . |

OTHER PUBLICATIONS

Ghandhi, S. K., "VLSI Fabrication Principles, Silicon and Gallium Arsenide", 1983, pp. 385–390.
Ghandi, S. K., "VLSI Fabrication Principles, Silicon and Gallium Arsenide", 1983, pp. 327–328.
W. R. Burger, C. Lage, B. Landau, M. DeLong, J. Small; "An Advanced 0.8μm Complementary BiCMOS Technology For Ultra–High Speed Circuit Performance"; Proceedings Of The Bipolar Circuits And Technology Meeting; Sep. 1990; pp. 78–81.
Ali Iranmanesh, Steve Jurichocj, Vida Ilderem, Rick Jerome, SP Joshi, Madan Biswal, Bami Bastani; "Advanced Single Poly BiCMOS Technology For High Performance Programmable TTL/ECL Applications"; Proceedings Of The 1990 Bipolar Circuits And Technology Meeting; Sep. 1990; pp. 154–157.
H. Momose, T. Maeda, K. Inoue, I Kamohara, T. Kobayashi, Y. Urakawa, and K. Maeguchi, "Characterization of Speed And Stability Of BiNMOS Gates With A Bipolar And PMOSFET Merged Structure", Dec. 9–12, 1990, International Electron Devices Meeting, pp. 231–234.
H. Momose, T. Maeda, K. Inoue, Y. Urakawa and K. Maeguchi, "Novel Test Structures For The Characterization Of Latch–Up Tolerance In A Bipolar And MOSFET Merged Device", Proc. IEEE 1991 Int. COnference on Microelectronic Test Structures, vol. 4, No. 1, Mar. 1991, pp. 225–230.

*Primary Examiner*—Chandra Chaudhari
*Attorney, Agent, or Firm*—Jacqueline J. Garner; Jim Brady; Richard L. Donaldson

[57] ABSTRACT

A merged BiCMOS device 10 having a bipolar transistor 60 and a PMOS transistor 64 formed in the same well region 18a. Bipolar transistor 60 is comprised of an emitter electrode 30, base region 26, and collector region formed by well region 18b. Emitter electrode 30 is separated from base region 26 by thick oxide 24. PMOS transistor 64 comprises source/drain regions 52 and 52a, gate electrode 40, and gate oxide 36. PMOS transistor 64 may also comprises LDD regions 44. Source/drain region 52a is in contact with base region 26. If desired, the emitter electrode 30 and gate electrode 40 may be silicided.

6 Claims, 11 Drawing Sheets

BICMOS PROCESS THAT SUPPORTS MERGED DEVICES

This is a continuation of application Ser. No. 08/106,458, now U.S. Pat. No. 5,334,549, filed Aug. 13, 1993.

FIELD OF THE INVENTION

This invention generally relates to semiconductor processing and more specifically to BiCMOS processes.

BACKGROUND OF THE INVENTION

The integration of MOSFET structures and bipolar transistors on a single substrate has become very desirable. As is well known in the art, digital and linear functions are often performed by integrated circuits using either bipolar or metal-oxide semiconductor (MOS) technology. Bipolar integrated circuits, of course provide higher speed operation and greater drive currents than the MOS circuits, at the cost of higher power dissipation, especially when compared against complementary MOS (CMOS) circuits. Advances in manufacturing technology have allowed the use of both bipolar and CMOS transistors in the same integrated circuit (commonly referred to as BiCMOS devices). Further exploitation of the high current driving capabilities of the bipolar transistor is important to obtaining even higher levels of bipolar or merged bipolar CMOS integration.

Bipolar transistors are typically formed by using a moat region for the base of the bipolar transistor, doped polysilicon for the emitter, and a well region for the collector. Additional moat regions are then used to form any Schottky diodes or source/drain regions of PMOS transistors.

SUMMARY OF THE INVENTION

Generally, and in one form of the invention, a device and method for forming a semiconductor device is disclosed. A first insulator layer is formed over a surface of a semiconductor body having a well region. The base region is implanted through the first insulation layer in a first portion of the well region. Next, an emitter electrode is formed over the first insulator layer and the base region. A portion of the emitter electrode extends through the first insulator layer to the base region. The exposed portion of the first insulator layer is removed. Next, a second insulator layer is grown on the surface of the semiconductor body. A plurality of gate electrodes is then formed on the second insulator layer. At least one gate electrode is formed over the first well region. A plurality of source/drain regions are formed at the surface of the semiconductor body. One of the source/drain regions is formed in the well region between the gate electrode and the emitter electrode. This source/drain region is in contact with the base region.

An advantage of the invention is providing a merged BiCMOS device having both PMOS and bipolar transistors in the same moat.

A further advantage of the invention is providing a merged bipolar/PMOS structure that requires less area.

A further advantage of the invention is providing a BiCMOS process that allows for a lower temperature source/drain anneal thereby reducing short channel effects.

These and other advantages will be apparent to those of ordinary skill in the art having reference to this specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The preferred embodiment of the invention is described herein as incorporated into a BiCMOS structure having a bipolar transistor and a PMOS transistor merged into the same well region.

Figure 1:
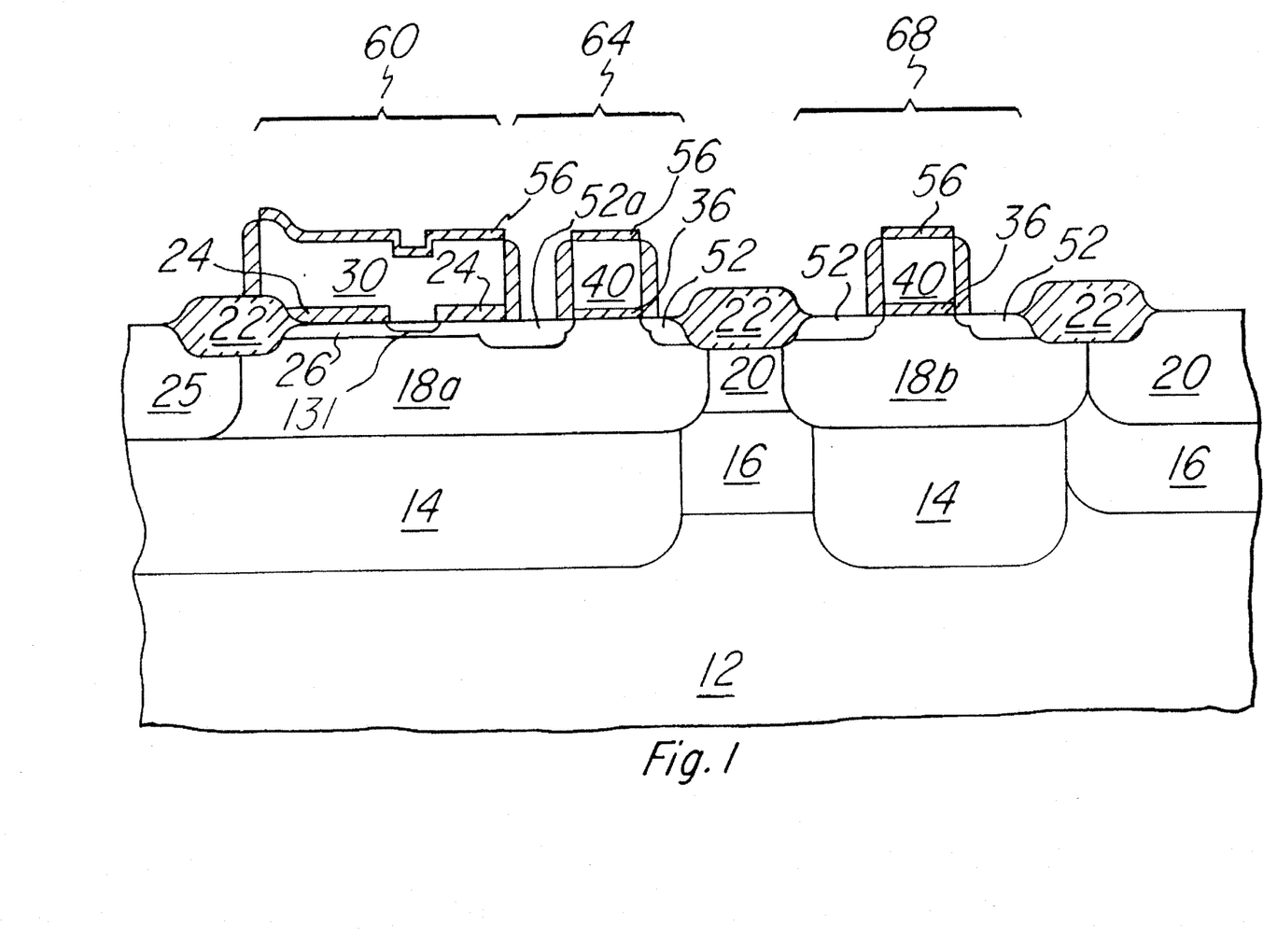
FIG. 1 is a cross-sectional diagram of the preferred embodiment of the invention.

FIG. 1 illustrates, in cross-section, bipolar transistor 60 and p-channel transistors 64 and 68. The structure is formed into a substrate 12 which, in this embodiment, is p-type silicon. Buried n+ region 14 in bipolar transistor 60 serves as a subcollector, in the conventional manner, with n+ region 25 providing a surface contact thereto. N region 18a serves as the collector region in bipolar transistor 60 and as the well region for p-channel transistor 64. N region 18b is the well region for p-channel transistor 68. Intrinsic base 26 is a p-type region disposed within n region 18a–b. Emitter electrode 30 may be a doped polysilicon layer which extends through an opening in insulator layer 24 to intrinsic base region 26. P+ region 52a serves as both the extrinsic base region of bipolar transistor 60 and as one of the source/drain regions for p-channel transistor 64. P+ regions 52 serve as the remaining source/drain regions for p-channel transistors 64 and 68. Doped polysilicon may be used to form gates 40 of transistors 64 and 68. Gate oxide 36 is disposed between gates 40 and n regions 18a–b. Buried region 16 is located below region 20. Field insulating regions 22 isolate intrinsic base region 26 from collector contact 25 and p-channel transistors 64 and 68 from each other. Emitter electrode 30 and gates 40 may optionally be silicided to form TiSi$_2$ layer 56. N+ regions 14 below transistors 64 and 68 are separated by buried p region 16 and n regions 18a–b are separated by p region 20 to allow the n-type regions 18a–b of the two transistors to be at different potentials.

Figure 2A:
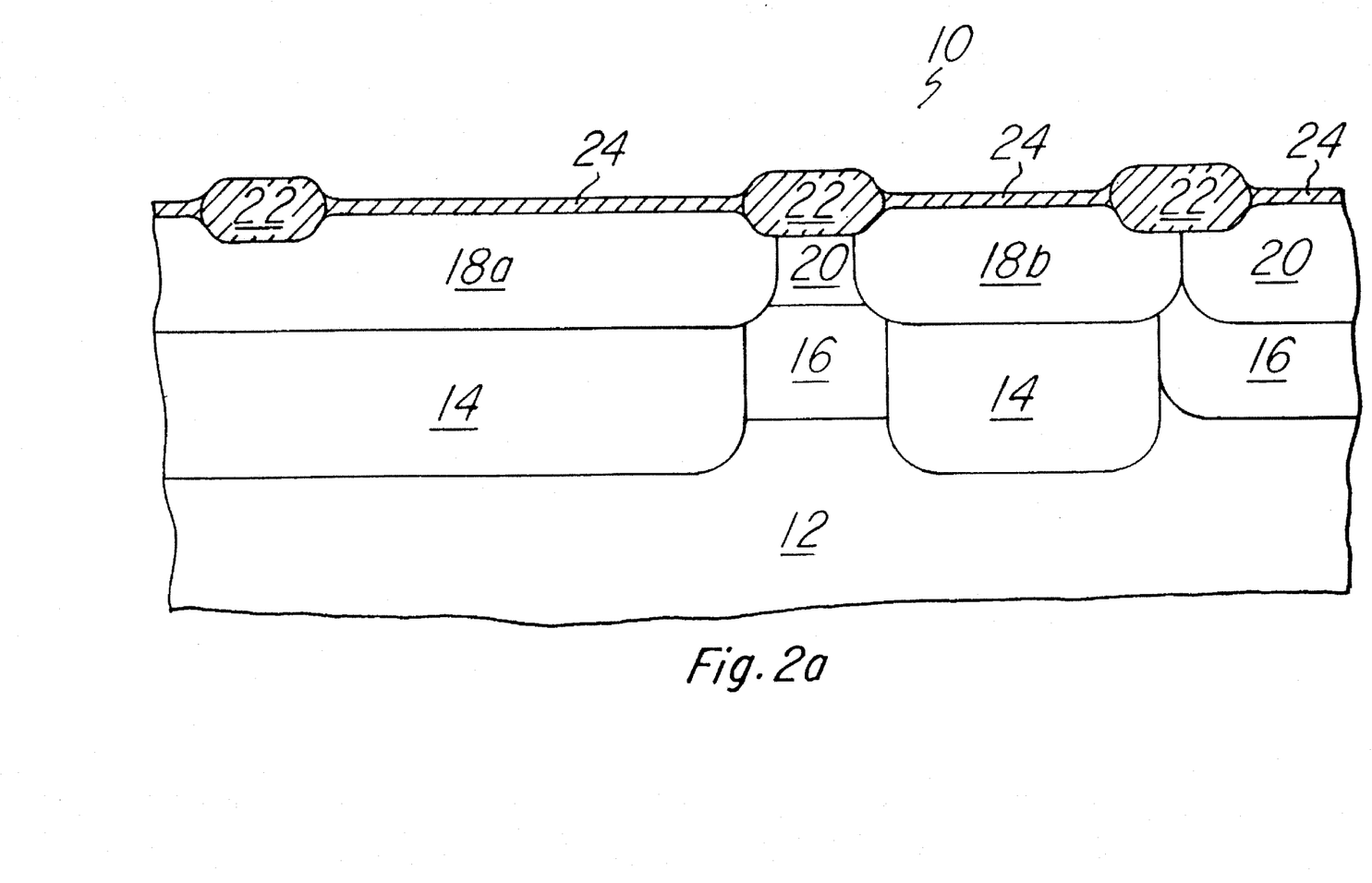
FIGS. 2a–i are cross-section diagrams showing various stages of fabrication of the preferred embodiment of the invention.

FIG. 2a illustrates structure 10 after the formation on n+ buried layers 14, p buried layers 16, n-type regions 18a–b, p-type regions 20, field insulating regions 22, and insulator layer 24. Methods for forming the buried layers are described in U.S. Pat. No. 4,958,213, issued Sep. 18, 1990 and assigned to Texas Instruments Incorporated. A method for forming field insulating regions 22 is described in U.S. Pat. No. 4,541,167, issued Sep. 17, 1985, and assigned to Texas Instruments Incorporated. Insulator layer 24 may be a dummy gate oxide formed via an Anti Kooi oxidation followed by a deglaze to a thickness of less than 20 Å followed by a thermal oxidation to a thickness on the order of 300 Å. The formation of a merged BiCMOS device according to the invention into the structure of FIG. 2a will now be described.

Figure 2B:
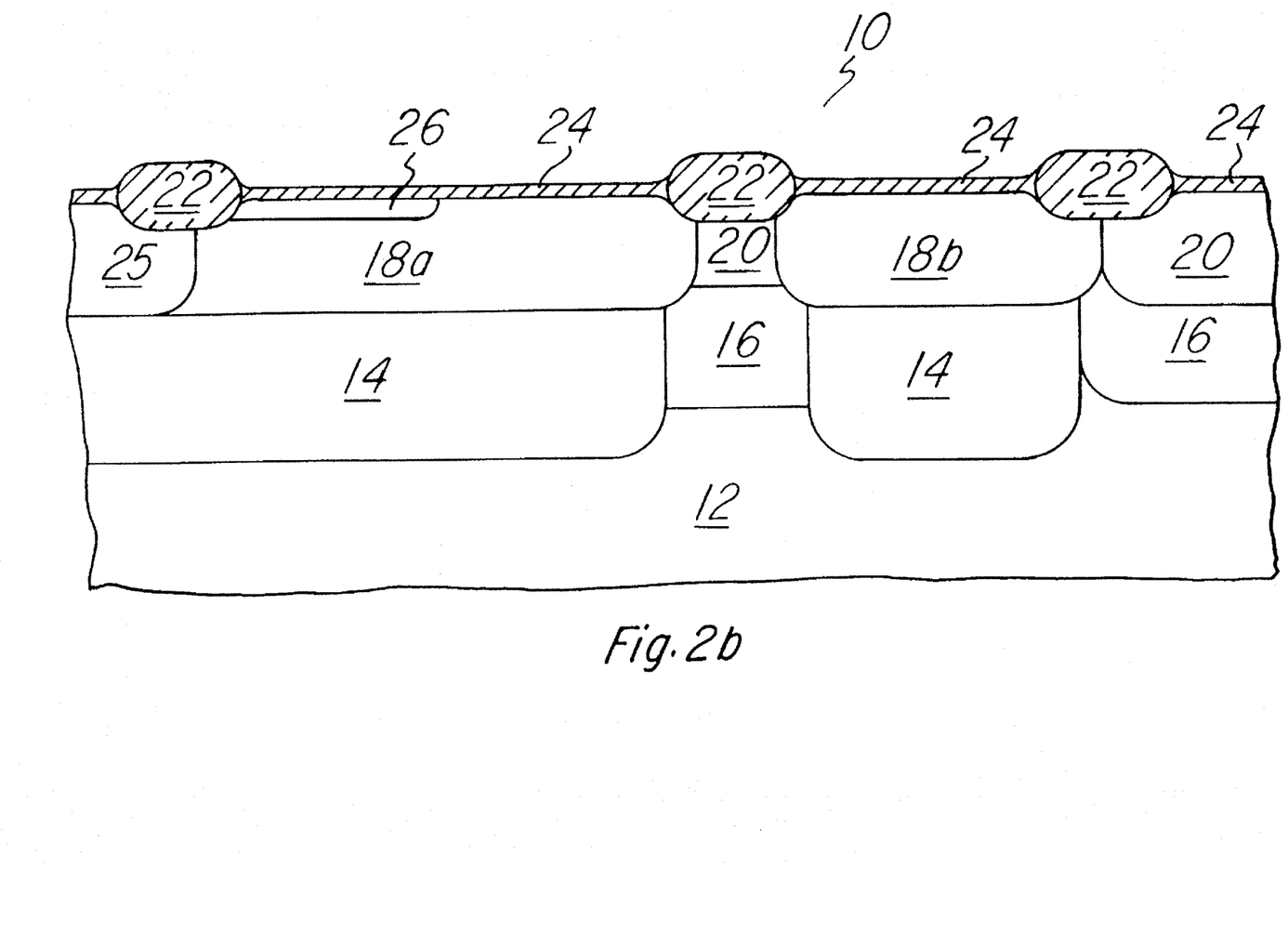

The surface of structure 10 is patterned and implanted using a n-type dopant to form a deep n-type region (collector contact 25) that extends through n region 18a to contact the subcollector, n+ region 14, as shown in FIG. 2b. Next, the $V_t$ adjust implants may be performed: one for NMOS transistors (not shown) and one for PMOS transistors 64 and 68. Still referring to FIG. 2b, the base region 26 is patterned and implanted with a p-type dopant (e.g. boron 7.013 cm at 10 Kev).

Figure 2C:
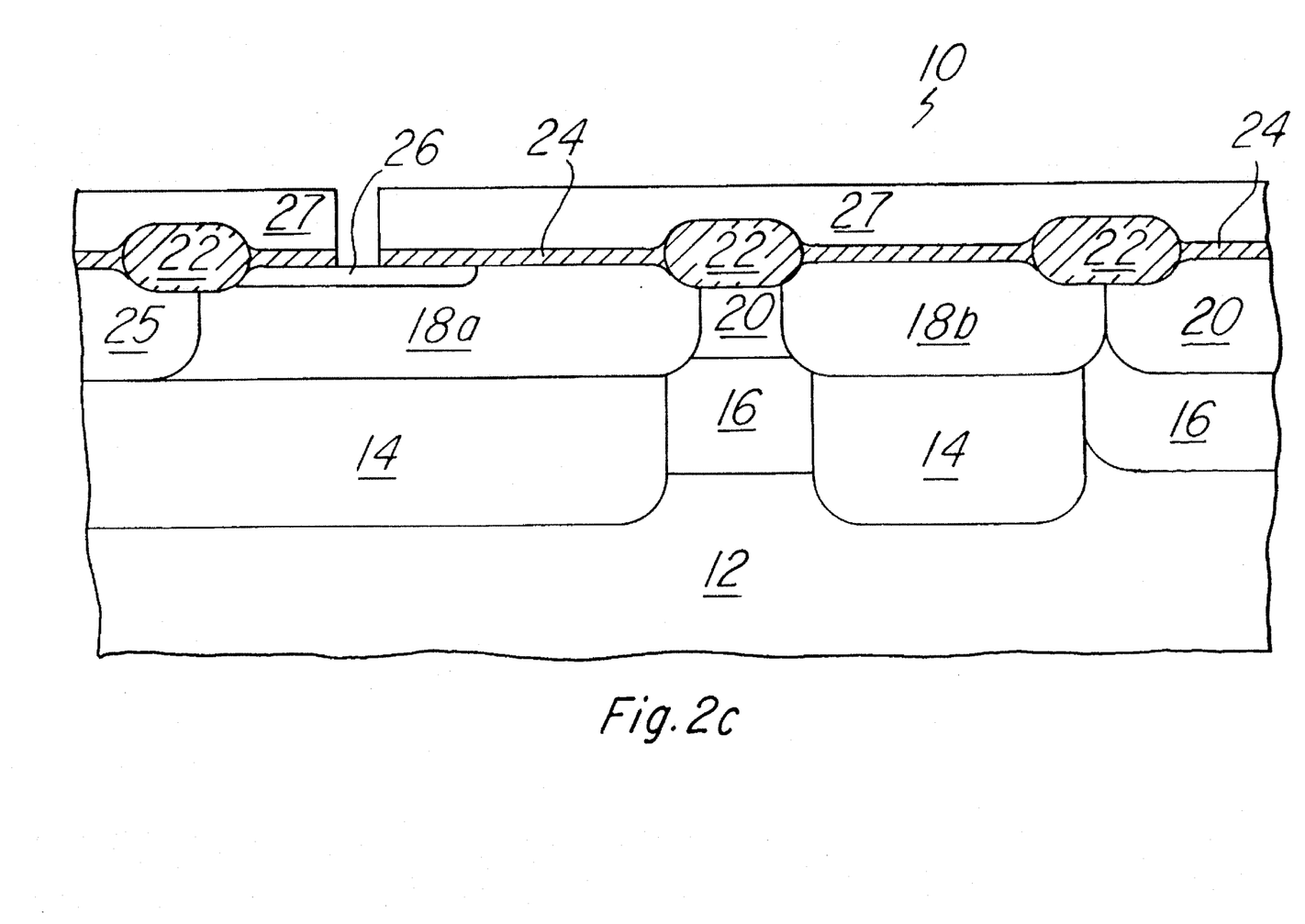
Figure 2D:
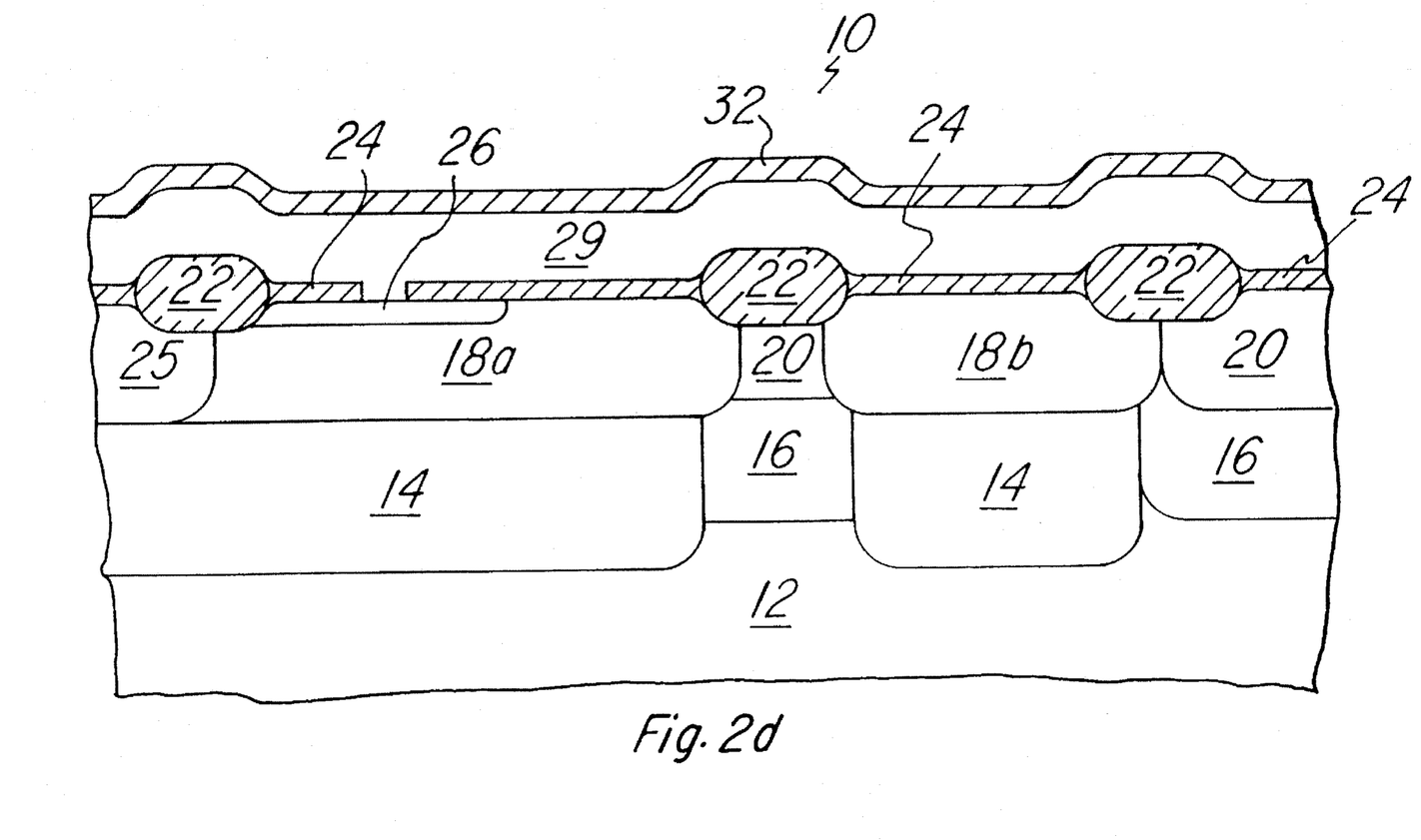
Figure 2E:
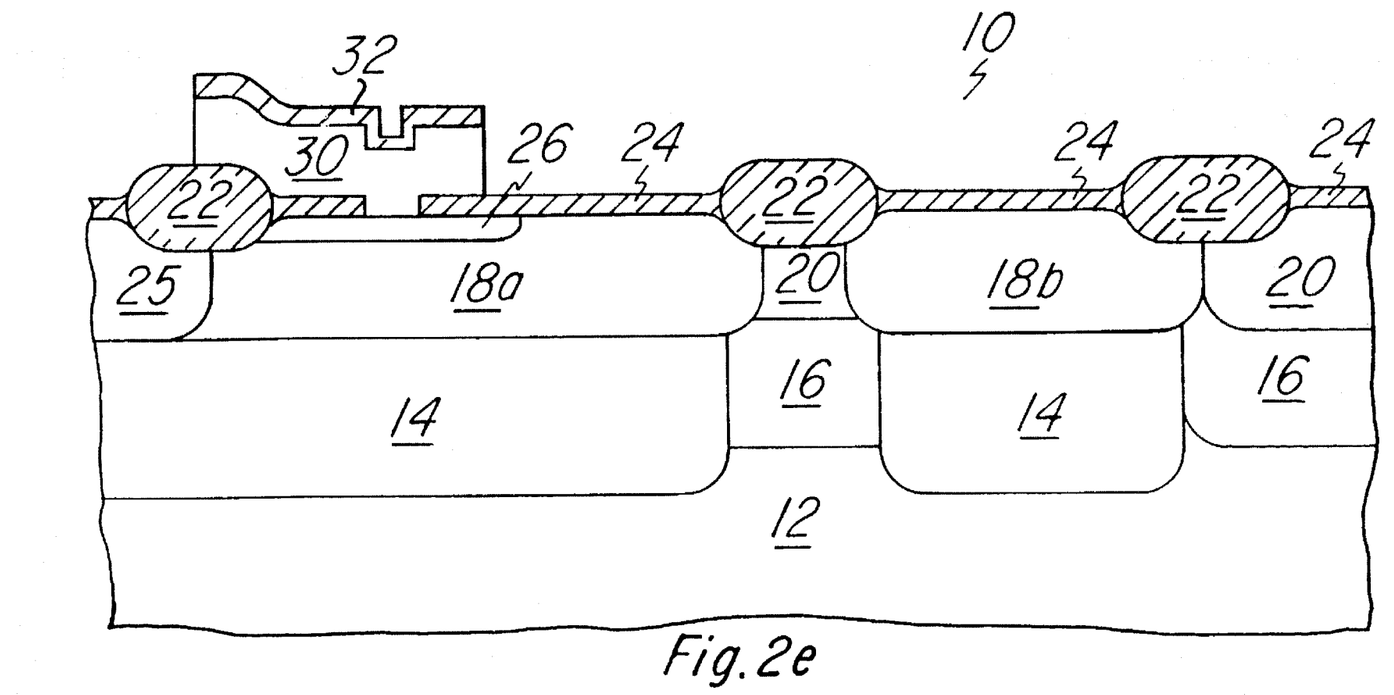

Referring to FIG. 2c, masking layer 27 is used to expose a region of dummy oxide layer 24. The exposed oxide is then etched to expose a portion of base region 26. Masking layer 27 is then removed and a deglaze is performed (e.g., 10% HF for 10 seconds). Referring to FIG. 2d, a layer of conductive material, such as polysilicon layer 29, is deposited to a thickness on the order of 2500 Å. Next, polysilicon layer 29 may be doped n-type via ion implantation. Alternatively, the polysilicon may be doped in-situ during deposition. A layer of nitride 32 is deposited over polysilicon layer 29. Nitride layer 32 may have a thickness on the order of 500 Å. Polysilicon layer 29 and nitride layer 32 are then patterned and etched by conventional techniques as shown in FIG. 2e to form emitter electrode 30. Nitride layer 32 prevents oxidation of emitter electrode 30 during subsequent processing steps.

Figure 2F:
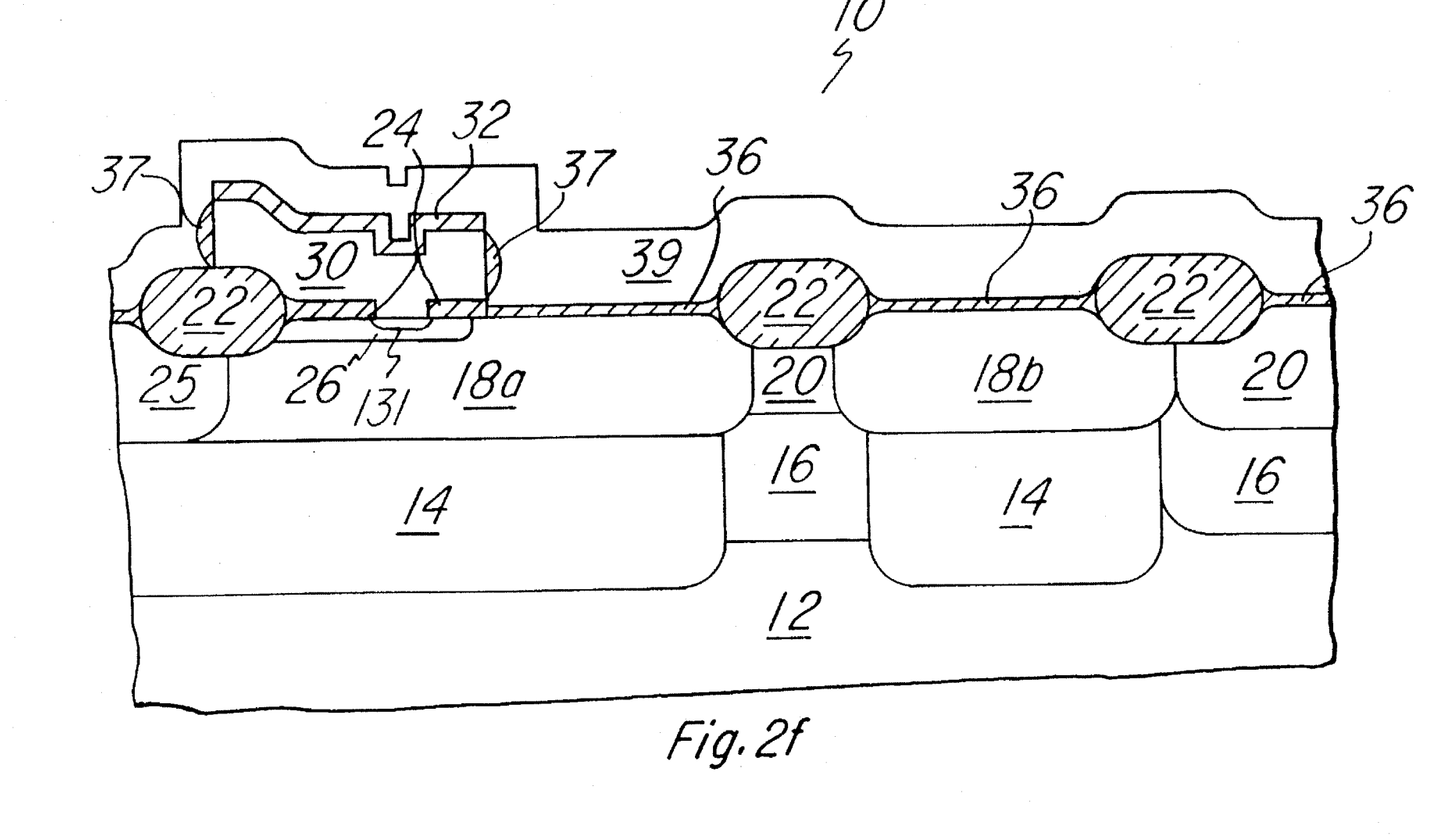
Figure 2G:
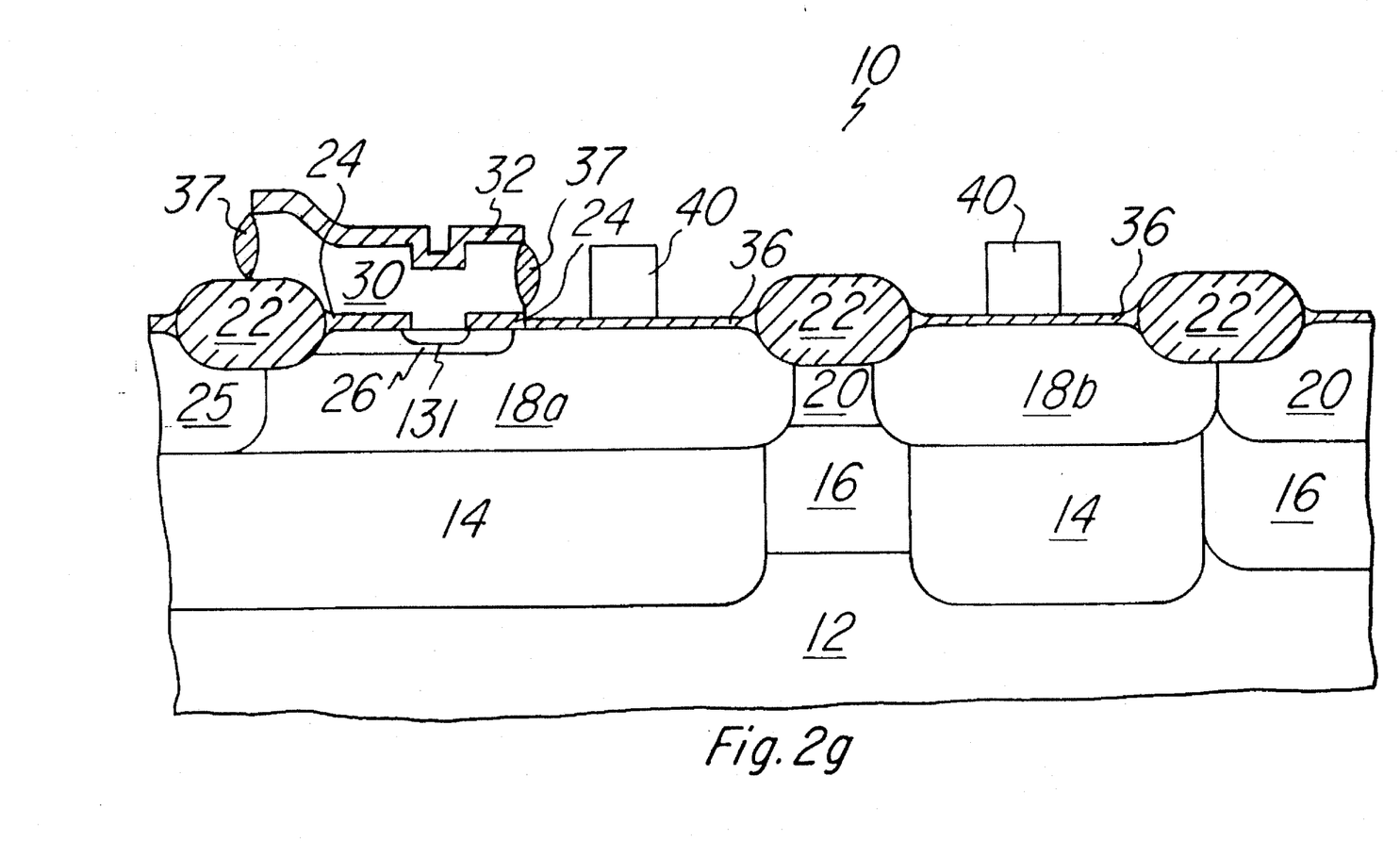

Referring to FIG. 2f, the exposed portions of dummy oxide layer 24 are then removed using a deglaze and replaced with an insulator layer such as gate oxide layer 36. Gate oxide layer 36 is formed by thermal oxidation and has a thickness on the order of 100 Å. During the growth of gate oxide layer 36, oxide 37 will also form on the vertical edges of emitter electrode 30 as shown in FIG. 2f. The thermal oxidation is performed at a temperature high enough to also serve as the emitter anneal thereby forming emitter region 131. In the preferred embodiment, the thermal oxidation is performed at a temperature on the order of 900° C. It will be apparent to those skilled in the art that other temperatures, including those used in rapid thermal processing (RTP) may alternatively be used. A second layer of conductive material, such as polysilicon layer 39, is deposited by way of LPCVD over the surface of structure 10, as shown in figure 2f. Polysilicon layer 39 has a thickness on the order of 3500 Å. Polysilicon layer 39 may then be doped via ion implantation. Alternatively, the polysilicon may have been doped in situ during deposition. Polysilicon layer 39 is patterned and etched to form gates 40, as shown in FIG. 2g.

Figure 2H:
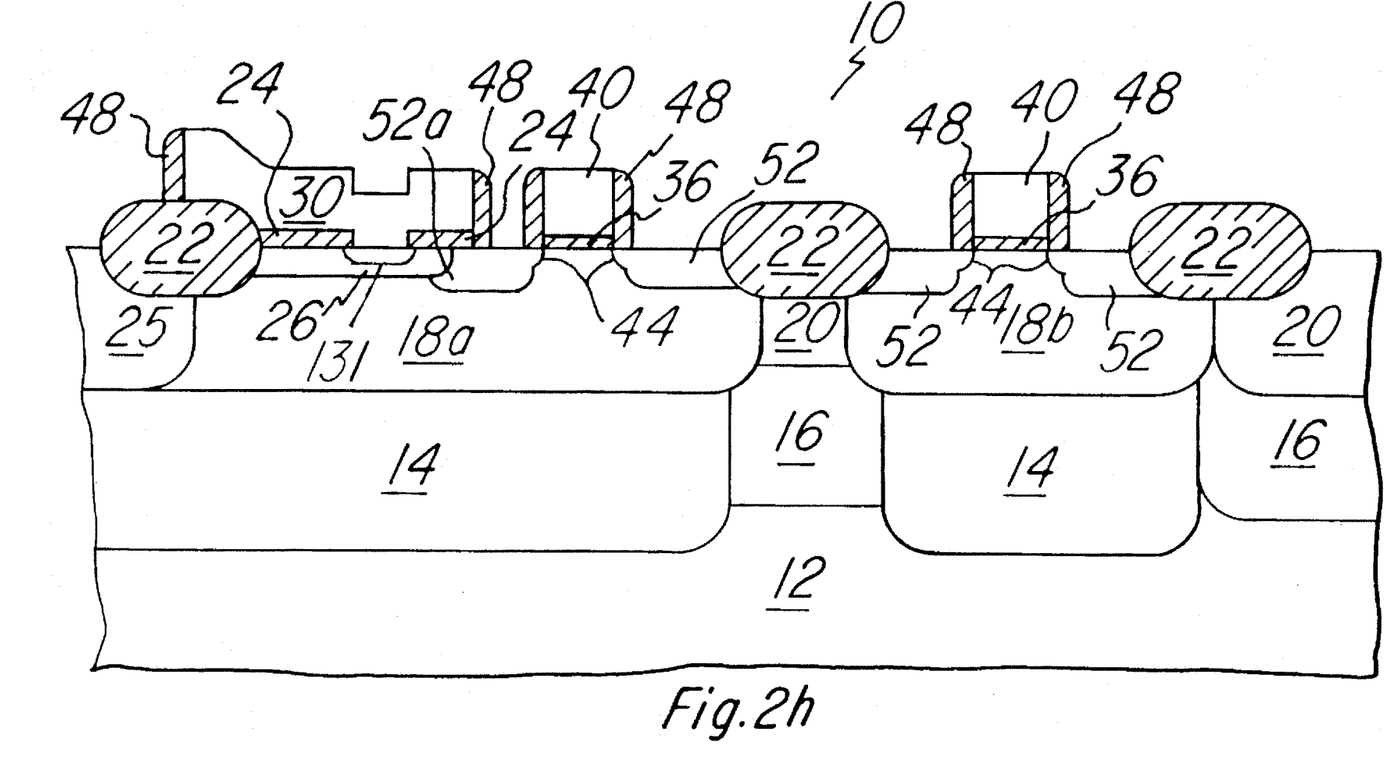

Referring to FIG. 2h, conventional techniques are then used to implant lightly doped drains (LDDs) 44, form sidewall spacers 48, and form source/drain regions 52 and 52a. It should be noted that LDDs 44 are optional and need not be formed. Sidewall spacers 48 are formed by depositing a dielectric layer and anisotropically etching the dielectric layer. Sidewall spacers 48 may be oxide or oxide/nitride. It should be noted that the anisotropic etch used to form sidewall spacers 48 also removes nitride layer 32 and may remove exposed portions of gate oxide layer 36. After sidewall spacers 48 are formed, source/drain regions 52 and 52a are implanted and annealed. It should be noted that source/drain region 52a also serves as the extrinsic base of the bipolar transistor. Because the doped emitter electrode was previously "annealed" during the formation of oxide layer 36, source/drain regions 52 and 52a may be annealed at lower temperatures (on the order of 850° C. and less than 900° C.) thereby reducing short channel effects.

Figure 2I:
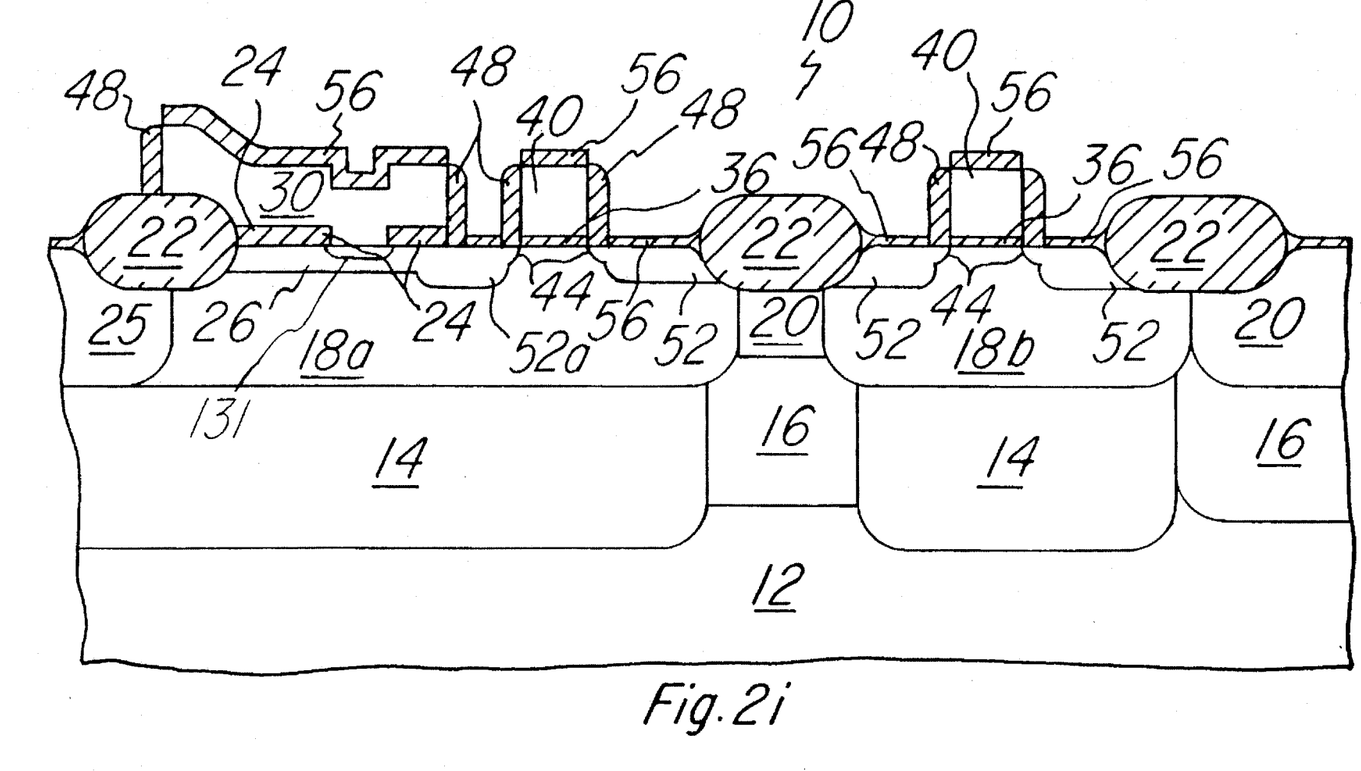

Subsequent to the processing steps described above, the gates 40, source/drain regions 52 and 52a, and emitter electrode 30 may optionally be silicided. A layer of refractory metal (not shown) is deposited over the surface of structure 10. The structure is annealed using a rapid thermal anneal, or alternatively a furnace anneal, in a nitrogen-containing ambient. This causes the layer of refractory metal to react with any exposed silicon to form silicide. Referring to FIG. 2i, silicide layer 56 is formed above emitter electrode 30, gates 40 and source/drain regions 52 and 52a. Elsewhere, a layer of refractory metal-nitride and/or unreacted metal (not shown) is formed. The layer of refractory metal-nitride and/or unreacted metal is then removed.

Figure 3:
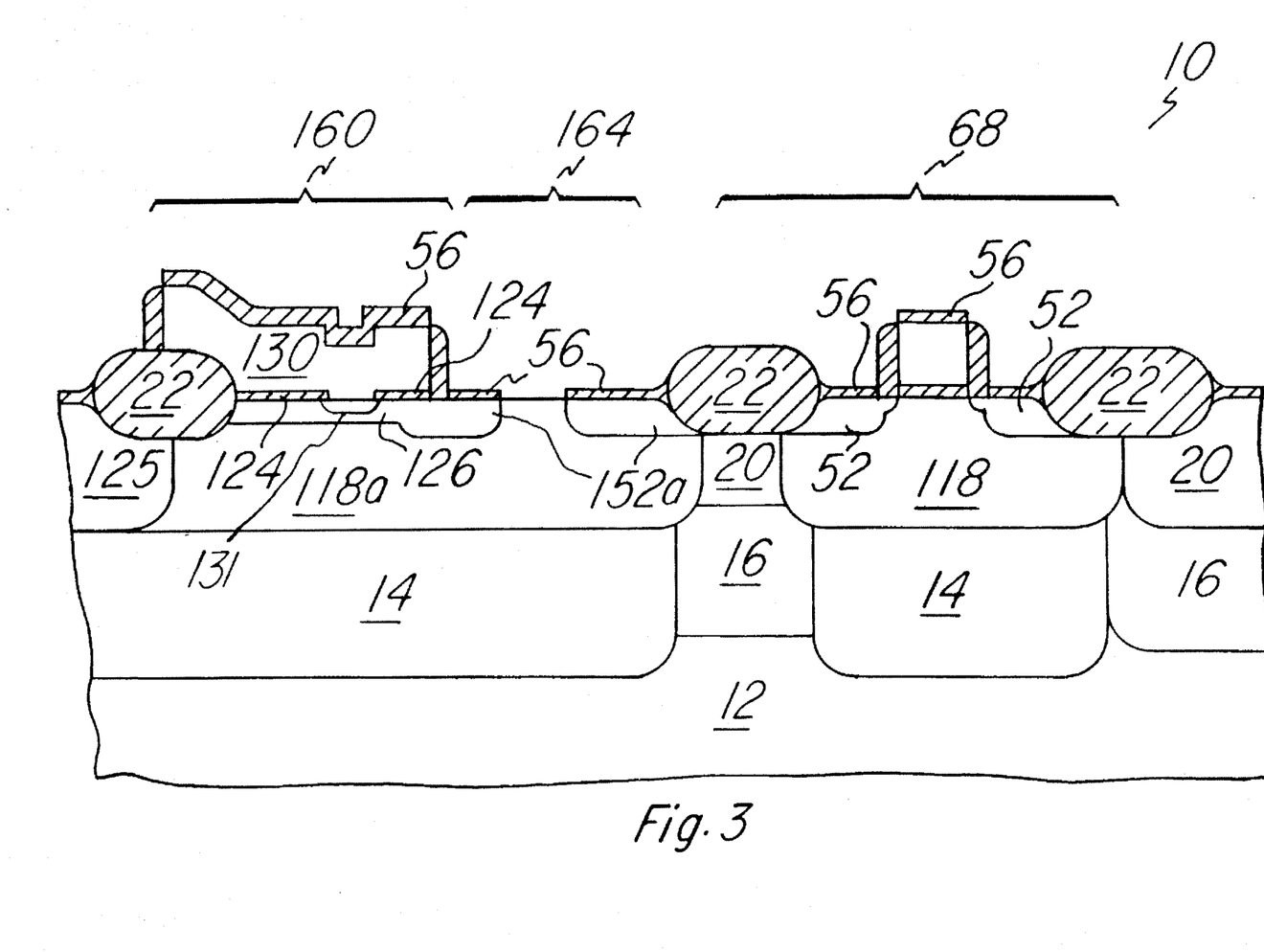
FIG. 3 is a cross-sectional diagram of an alternative preferred embodiment of the invention.

Although the above describes the invention in conjunction with a BiCMOS device having a merged bipolar transistor and PMOS transistor, it should be noted that other devices may also be merged with bipolar transistors and still realize the benefits of the invention. For example, FIG. 3 shows a merged BiCMOS device which contains a schottky diode 164 formed in the same well region 118a as bipolar transistor 160. Schottky diode 164 has a guard ring 152a which is connected to base region 126.

Subsequent to the completion of the methods described above, interconnecting metallization is then formed for making contact to the active regions of FIGS. 1 and 3. Methods for forming such interconnections are well known in the art. Individual circuits are then separated from portions of substrate 12 and external connections made thereto by way of wire bonding, direct bump bonding, or the like, as is well known in the art. The individual circuits may then be packaged into a dual-in-line package, a chip carrier, or another type of package. An example of such a package is described in U.S. Pat. No. 4,495,376, issued Jan. 22, 1985, and assigned to Texas Instruments, Inc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a BiCMOS device, comprising the steps of:

forming a bipolar transistor except for the emitter region including the step of forming a doped electrode using a first polysilicon layer at a surface of a semiconductor body;

growing a gate oxide layer over said semiconductor body such that dopant from said doped electrode diffuses from said doped electrode into said semiconductor body to form an emitter region; and forming at least one field effect transistor on said semiconductor body including the step of forming source/drain regions using an anneal temperature less than 900° C., wherein the step of forming said at least one field effect transistor comprises the steps of:
    depositing a second layer of polysilicon over said gate oxide layer;
    etching said second layer of polysilicon to form at least one gate electrode;
    implanting a plurality of source/drain regions; and
    annealing said source/drain regions at a temperature less than 900° C.

2. The method of claim 1 wherein said gate oxide layer serves as a gate oxide for said at least one field effect transistor.

3. The method of claim 1 wherein said gate oxide layer is grown at a temperature greater than 850° C.

4. The method of claim 1 wherein said bipolar transistor and said at least one field effect transistor are formed in a first well region and one of said source/drain regions is in contact with a base region of said bipolar transistor.

5. The method of claim 1 wherein said step of forming said bipolar transistor comprises the steps of:

forming an insulator layer over the surface of the semiconductor body;

forming a base region in said semiconductor body;

depositing a first layer of polysilicon over the insulator layer; and etching said polysilicon layer to form said doped electrode, said doped electrode extending through said insulator layer to said base region.

6. A method of forming a BiCMOS device, comprising the steps of:

forming a bipolar transistor except for the emitter region including the step of forming a doped electrode using a first polysilicon layer at a surface of a semiconductor body;

growing a gate oxide layer over said semiconductor body, said step of growing said gate oxide layer serving as an emitter anneal; and forming at least one field effect transistor on said semiconductor body including the step of forming source/drain regions using a single anneal having a temperature less than 900° C. to reduce short channel effects;

wherein the step of forming said at least one field effect transistors comprises the steps of:

depositing a second layer of polysilicon over said gate oxide layer;

etching said second layer of polysilicon to form at least one gate electrode;

implanting a plurality of source/drain regions; and annealing said source/drain regions at a temperature less than 900° C.

* * * * *